US009024543B2

(12) United States Patent
Vermeulen

(10) Patent No.: US 9,024,543 B2
(45) Date of Patent: May 5, 2015

(54) METHOD AND APPARATUS FOR CONTROLLING AN ILLUMINATION SYSTEM IN A TEMPERATURE CONTROLLED ENVIRONMENT

(75) Inventor: Markus C. Vermeulen, Nuenen (NL)

(73) Assignee: Koninklijkle Philips N.V., Eindhoven (NL)

( * ) Notice: Subject to any disclaimer, the term of this patent is extended or adjusted under 35 U.S.C. 154(b) by 522 days.

(21) Appl. No.: 13/124,414

(22) PCT Filed: Oct. 12, 2009

(86) PCT No.: PCT/IB2009/054465

§ 371 (c)(1), (2), (4) Date: Apr. 15, 2011

(87) PCT Pub. No.: WO2010/044045

PCT Pub. Date: Apr. 22, 2010

(65) Prior Publication Data

US 2011/0199022 A1 Aug. 18, 2011

(30) Foreign Application Priority Data

Oct. 17, 2008 (EP) .................................... 08166850

(51) Int. Cl.

*H03K 19/0175* (2006.01)
*H04L 25/02* (2006.01)
*H05B 37/02* (2006.01)
*F21V 23/04* (2006.01)

(52) U.S. Cl.

CPC ............. *H05B 37/02* (2013.01); *F21V 23/0442* (2013.01)

(58) Field of Classification Search

USPC .......... 315/309, 113, 117, 118, 307; 362/276, 362/580

See application file for complete search history.

(56) References Cited

U.S. PATENT DOCUMENTS

2006/0023456 A1 2/2006 Wang
2007/0087614 A1 4/2007 Huch et al.
2007/0125104 A1 6/2007 Ehlers
2007/0171647 A1 7/2007 Artwohl et al.

(Continued)

FOREIGN PATENT DOCUMENTS

DE 202007013346 U1 11/2007
JP 58188398 A 11/1983

(Continued)

*Primary Examiner* — Daniel D Chang

(74) *Attorney, Agent, or Firm* — Meenakshy Chakravorty

(57) ABSTRACT

The present invention relates to a method for controlling the illumination system in a temperature controlled environment, and to a control system for a temperature controlled environment having an illumination system. More specifically, the invention relates to a method wherein output of the illumination system causes a temperature response in the temperature controlled environment, the temperature response being detected by a sensor, the method comprising regulating the temperature adaptively based on the output of the illumination system and the associated temperature response. The control system for the temperature controlled environment, having an illumination system, comprises a sensor proximate to a casing of the temperature controlled environment and is adapted to control the illumination system, wherein output of the illumination system causes a temperature response in the temperature controlled environment, the temperature response being detected by the sensor, and the control system is adapted to regulate the temperature adaptively based on the output of the illumination system and the associated temperature response.

15 Claims, 3 Drawing Sheets

(56) References Cited

U.S. PATENT DOCUMENTS

| | | | | |
|---|---|---|---|---|
| 2009/0021955 | A1* | 1/2009 | Kuang et al. | 362/479 |
| 2009/0079358 | A1* | 3/2009 | Shteynberg et al. | 315/291 |
| 2009/0289580 | A1* | 11/2009 | Dunn et al. | 315/307 |

FOREIGN PATENT DOCUMENTS

| | | | |
|---|---|---|---|
| JP | 6095065 | A | 4/1994 |
| JP | H0960952 | A | 3/1997 |
| JP | 2001133100 | A | 5/2001 |
| JP | 2003157985 | A | 5/2003 |
| JP | 2007173126 | A | 7/2007 |
| JP | 2009516328 | A | 4/2009 |
| WO | 9931560 | A2 | 6/1999 |
| WO | 2007087614 | A2 | 8/2007 |
| WO | 2008047336 | A2 | 4/2008 |
| WO | 2008120127 | A1 | 10/2008 |

* cited by examiner

METHOD AND APPARATUS FOR CONTROLLING AN ILLUMINATION SYSTEM IN A TEMPERATURE CONTROLLED ENVIRONMENT

FIELD OF THE INVENTION

The present invention relates to a method for controlling the illumination system in a temperature controlled environment. The present invention further relates to a control system for a temperature controlled environment having an illumination system.

BACKGROUND OF THE INVENTION

Currently in supermarkets multideck coolers are used to display a variety of fresh, pre-packed food products. These products are normally highly perishable and will go off very rapidly, especially if the maximum allowable temperature is exceeded. In many countries there is legislation that products which have been stored at temperatures above the maximum allowed temperature, these products may either not be sold anymore or the sell-by date must be reduced. The latter is often not easy as the sell-by date is pre-printed on the package and cannot be changed easily. Under normal circumstances, the multideck coolers used to display such products ensure that that temperature is ensured. However, when the cooler is not packed properly (too much products are inside the cooler) the airflow is disturbed and the heat generated by the lamps under the shelves will drive up the shelf temperature beyond the maximum allowable temperature. This problem makes that supermarkets are hesitant to put lighting under shelves as they might legally be held liable when foods products have been gone off as a result of exceeding the maximum temperature or if there is a claim from, for example, the Food and Drug Administration (US), Foods Standards Agency (UK) or 'Voedsel en warenauthoriteit' (Netherlands).

US 2007087614 A2 describes a control system for an illuminated display case, the display case including a sensor that may be used as a switch or as a controller to adjust the power being provided to the light sources of the display case. Further, an implementation of a control scheme is described wherein the voltage to the light sources is shut off when the sensor detects that the temperature inside the display case exceeds a predetermined temperature. When the temperature inside the display case returns to acceptable levels, the light sources are provided with power.

With conventional illuminated displays there is a risk for temperature over-shoot as ambient conditions change frequently. Therefore, there is a need for an improved illumination control.

SUMMARY OF THE INVENTION

In view of the above, it would be desirable to provide a method for controlling the illumination system in a temperature controlled environment. It would also be desirable to provide a control system for a temperature controlled environment having an illumination system. These and other objects are achieved by methods and products according to the present invention.

According to a first aspect of the present invention, there is provided a method for controlling an illumination system in a temperature controlled environment. Output of the illumination system causes a temperature response in the temperature controlled environment where the temperature response is detected by a sensor. The temperature is adaptively regulated based on output of the illumination system and associated temperature response. The adaptive regulation depending on the output of the illumination system and the temperature response results in that a greater precision in temperature control is achieved, in particular in conditions with varying ambient factors. There are several ambient factors that will influence the temperature response of the temperature controlled environment, such as the amount of items in contact with the temperature controlled environment, which may have the purpose to either cool or heat the items. Further, the thermal characteristics of the items, or any casing that may encapsulate the temperature controlled environment or any other element in contact with the temperature controlled environment will influence the temperature response caused by the output of the illumination system, and also the location of such items or elements. The output of the illumination system may be illumination intensity or power consumption of the illumination system, or any other parameter defining illumination output or may be correlated to the illumination output. The temperature response may be construed as the change in temperature with the output of the illumination system. The amount of heat generated by the illumination system is directly correlated to the amount of power dissipated by the illumination system, which is directly correlated to the heat load of the illumination system. The temperature response can therefore be influenced directly by changing the output of the illumination system.

In embodiments of the present invention the delay of the temperature response may be determined The delay may be construed as the gradual variation between a first temperature value associated with a first output and a second temperature associated with a second output of the illumination system. By determining the delay of the temperature response in the temperature controlled environment the effect of the aggregate of the ambient factors, including ambient temperature, is quantified. As a result a modification in output of the illumination system may be predicted to account for subsequent temperature variations caused by the ambient factors.

In embodiments of the present invention the output may involve a change between a first and second value of an illumination parameter, thereby changing the output. By having a change in the output between a first and second illumination parameter the delay in the temperature response can be determined when changing from the first and second illumination parameter value. Advantageously the variation between the first and second illumination parameter is within a non-perceivable limit to the naked eye.

In embodiments of the present invention the output of the illumination system may involve at least a first and second change being separated by a predetermined time interval. A change between a first and second illumination parameter may occur in a repeated sequence in order to continuously determine the delay in the temperature response at each instant change of output. This is advantageous as the ambient conditions and consequently the temperature response may be subject to variations throughout the control period. The time intervals between each instant change may be chosen to reflect the frequency in the number of variations of the ambient factors.

In embodiments of the present invention the temperature response may comprise temperature characteristics of at least a first and second temperature value, the at least a first and second temperature value is associated with at least a first and second time value, wherein the determining of the delay may comprise analyzing the temperature characteristics between the at least first and second time value based on a temperature lag, derivatives, and area, or any combinations thereof of.

The temperature response caused by the output of the illumination system may cause a change between at least a first and second temperature value in the temperature controlled environment. The temperature response may be construed as a set of temperature values as a function of the time elapsed from the instant change of output of the illumination system, where each temperature value is associated with a time value. Each of the temperature values and time values produce a set of temperature characteristics of the response and describes the delay from the instant change in illumination output. The aggregate of the ambient conditions produce a unique set of temperature characteristics. A result from determining temperature lag, derivatives, area, peak delay or peak duration of the temperature characteristics is that accurate control parameters of the control system may be determined and changed according to the new ambient conditions. As subsequent temperature variations may occur, the output of the illumination system may be predicted from the adapted control parameters to achieve accurate temperature regulation. The temperature lag may be construed as a part of the temperature characteristics where the variation in temperature is within a threshold interval. The ambient factors may influence the extent of the temperature lag. Hence, by determining the temperature lag, the ambient factors may be accounted for.

In embodiments of the present invention the temperature control may involve maintaining of a temperature within at least a first threshold value. Both an upper threshold value and a lower threshold value may be defined. By controlling the output of the illumination system the temperature may be maintained within the temperature threshold values.

In embodiments of the present invention the adaptive temperature control may involve a critically damped, or over damped control algorithm, or any combinations thereof. In controlling the output of the illumination system it is advantageous if the control system is critically dampened as this implies that there is no overshoot in the temperature response. All ambient factors have individually an impact on the temperature controlled environment and consequently the control system. While some variables like ambient temperature may change rather slowly, all input variables together may result in significant changes and should be compensated for. A variable which may change rapidly is when elements of different thermal characteristics are added to the temperature controlled environment, for example during restocking in a cooler, as the mass within the cooler changes dramatically within a reasonably short period of time. An increase in mass means a slower response of the system and hence the system becomes overcritically dampened during that process. Removing items gradually may move the system to undercritically dampened. The control system may be marginally overcritically dampened so that minor fluctuations in the ambient conditions, for example caused by removing an item from the temperature controlled environment, is not resulting in that the temperature threshold is passed. Substantial overdampening may be avoided as it may limit the range of ambient conditions in which the adaptive temperature regulation will provide sufficient control within the temperature threshold values. The temperature regulation by the overdamped system may be slower than the temperature regulation by the critically damped control system.

In embodiments of the present invention values may be logged for subsequent readout. In embodiments of the present invention values may be logged when a temperature threshold value has been exceeded. By storing values when an upper temperature threshold value or lower temperature threshold value has been exceeded it is possible to determine in retrospect the conditions for such events of exceeding temperature.

In embodiments of the present invention the values may be temperature, time, date, or any combinations thereof. As time and date is stored whenever a temperature threshold is exceeded it is possible to retrieve temperature history and determine when the temperature has been exceeded. The latter can be used as evidence to prove proper performance and to prove that products have been kept at the desired temperature.

In embodiments of the present invention the logged values may be encrypted. By encrypting the logged values any unauthorized modification of the values may be prevented. The encryption method may involve the use of a digital encryption key. This may be important if the temperature controlled environment is subjected to legal regulations. For example if the values are representative of when a temperature threshold has been exceeded the encryption of the values allows to ensure that legislation can be followed.

In embodiments of the present invention the logged values may be decrypted for readout. Only authorized readout is possible as decryption is required to retrieve the values. The values may be transferred over a secure link, such as a data link over a secure data network. A plurality of temperature controlled environments may be monitored as encrypted values of temperature, time and date, may be encrypted over a secure data link, or by a decryption device having access to a decryption key.

According to a second aspect of the present invention, there is provided an apparatus in the form of a control system for a temperature controlled environment having an illumination system, comprising a sensor proximate to a casing of the temperature controlled environment and adapted to control the illumination system, wherein output of the illumination system causes a temperature response in the temperature controlled environment. The temperature response is detected by the sensor. The control system is adapted to regulate the temperature adaptively based on output of the illumination system and associated temperature response.

In embodiments of the present invention the casing may comprise a shelf being exposed to the temperature controlled environment, wherein the sensor is in thermally conductive communication with the shelf. By having a conductive thermal contact to a shelf or any other element in contact with the temperature controlled environment the temperature response may be determined accurately which results in improved temperature regulation.

In embodiments of the present invention the sensor may be mounted within a predetermined threshold distance from the illumination system. If the sensor is mounted too far from the illumination system, items or elements closer to the illumination system may be exposed to temperatures exceeding the temperature threshold as the temperature response is not determined close to the items or elements. A threshold distance may be specified where the temperature outside the threshold distance may be maintained within a threshold value.

In embodiments of the present invention the illumination system may comprise at least one light source having at least one light emitting diode. Different types of light sources may be used in the illumination system. Any light sources where heat is conducted rather than emitted by the light source, such a Light Emitting Diodes are advantageous.

In embodiments of the present invention the control system may comprise a memory wherein values are logged for subsequent readout.

In embodiments of the present invention the memory unit is capable to log values when a temperature threshold value has been exceeded.

In embodiments of the present invention the values may be temperature, time, date, or any combinations thereof In embodiments of the present invention the control system may comprise an encryption module for encryption of logged values.

In embodiments of the present invention the control system may comprise a decryption module for decryption of logged values for readout.

Generally, the second aspect has the same advantages as the first aspect.

The features of the second aspect may be comprised also in the first aspect, and the features of the first aspect may be comprised also in the second aspect.

These and other aspect of the invention will be apparent from and elucidated with reference to the embodiments described hereinafter. Generally, all terms used in the claims are to be interpreted according to their ordinary meaning in the technical field, unless explicitly defined otherwise herein. All references to "a/an/the/said [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Other features and advantages of the present invention will become apparent from the following detailed description of a presently preferred embodiment, with reference to the accompanying drawings, in which.

DETAILED DESCRIPTION OF THE INVENTION

The present invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout.

In general, the present invention relates to a method for controlling the illumination system in a temperature controlled environment, and further to a control system for such environment having an illumination system.

Figure 1:
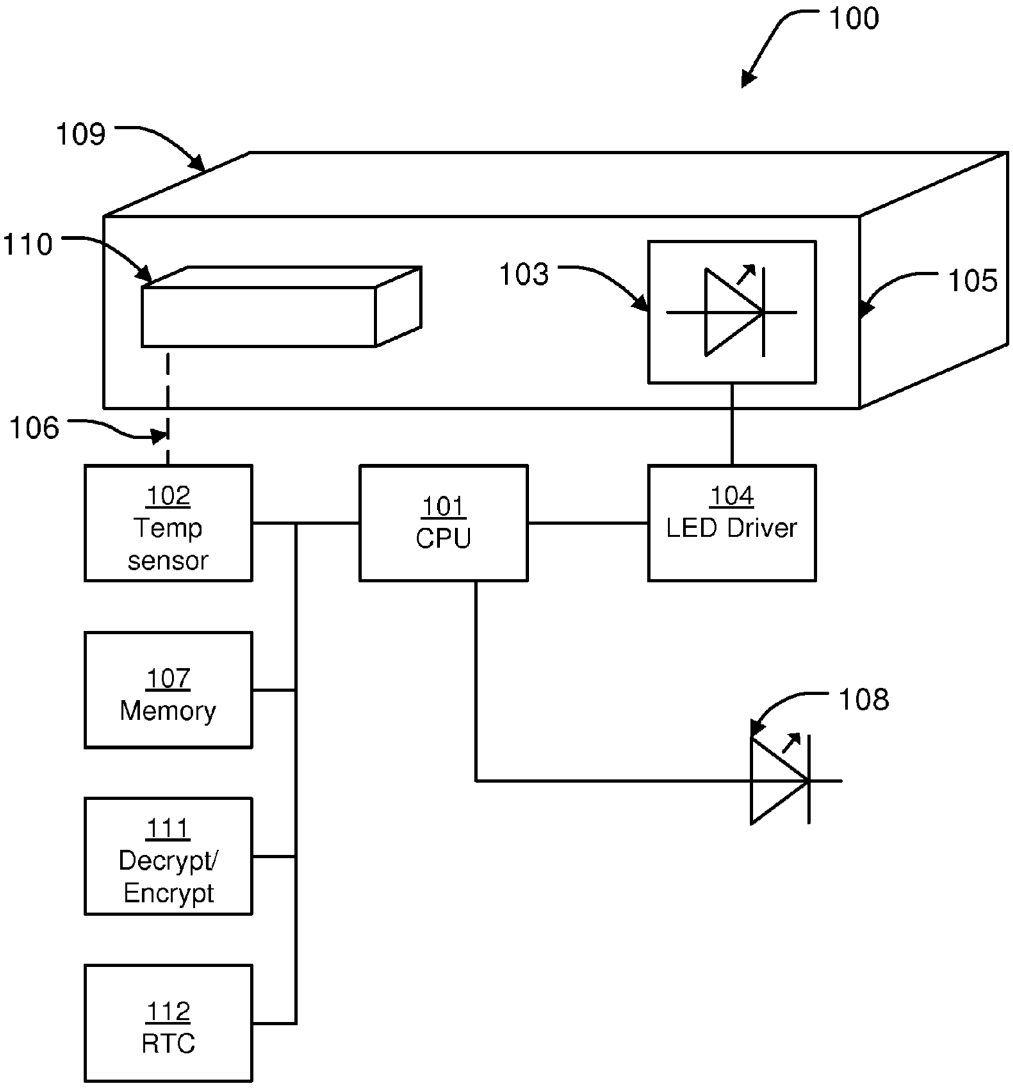
FIG. 1 shows an example of a control system according to the invention for controlling an illumination system.

A schematic drawing in one embodiment of the present invention is shown in FIG. 1, showing a control system 100 comprising a CPU 101 that is connected to a temperature sensor 102 and to a driver 104 for controlling the power to an illumination system 103. The CPU 101 may send a control signal to the driver 104, such as a pulse width modulation signal (PWM), which may cause the driver 104 to change the output of the illumination system 103, such as decrease or increase the light intensity. The illumination system 103 may comprise a LED module or any other means for providing light to a temperature controlled environment 105. The sensor 102 is mounted close to the temperature controlled environment 105, and may be proximate to a casing 109 surrounding the temperature controlled environment 105. Output of the illumination system 103 causes a temperature response in the temperature controlled environment 105 which is detected by the sensor 102. Output of the illumination system 103 may be construed as light intensity, light wavelength, or any other output from an illumination system that may be resulting in an increase or decrease in surrounding temperature. The CPU 101 controls the output of the illumination system 103 and receives the associated temperature data from the sensor 102 being representative of the temperature response. The temperature response is unique to the ambient factors in the temperature controlled environment 105. The control signal sent to the driver 104 is adapted based on the output and the associated response. The output of the illumination system 103 is adjusted according to the adapted control signal such that the surrounding temperature is regulated.

The sensor 102 is in thermal communication 106 with any element being exposed to the temperature controlled environment 105, such as a shelf 110 which may be part of the casing 109. In case the thermal communication is a thermally conductive, a good transfer of heat between the sensor 102 and the shelf 110 is ensured. The shelf 110 could support or be in thermal contact with other items being exposed to the temperature controlled environment 105. The thermal connection will affect the temperature response caused by the output of the illumination system 103.

The temperature response will also be affected by the distance between the illumination system 103 and the temperature sensor 102. The sensor 102 is mounted within a threshold distance from the illumination system 103 or heat source to get good coupling between the heat source and the sensor 102 and to avoid that temperature sensitive elements are closer to the heat source than the sensor 102 and thereby may have a different temperature than detected by the sensor 102. It may be possible to make a calibration and account for such temperature difference if a specific threshold distance is required.

In case the illumination system 103 comprise several light sources having at least one light emitting diode, each light source or LED may have a corresponding sensor 102. The output of each of the light sources or LED may accordingly be controlled and the temperature can be regulated at the surroundings at each of the locations of the light sources or LEDs. The control system 100 comprises a memory 107 which is connected to the CPU 101 and temperature sensor 102. The memory 107 logs data or values received by the CPU 101. The time at which the event has taken place is retrieved from the Real Time Clock 112. The Real time Clock 112 is fitted with battery backup to ensure that the time is maintained even when the power is switched off. The stored values can be read in subsequent analysis of the conditions in the temperature controlled environment 105. The memory may log the values upon the occurrence of specially selected events such as when a temperature threshold has been exceeded. The memory 107 logs the values either if the temperature exceeds an upper threshold or passes a lower threshold value. The logged values may be temperature, time, date, illumination parameter such as intensity, wavelength, or driver current, power, or driver control signal, or any other parameter used to control the illumination system or describing the conditions in the temperature controlled environment. The control system 100 comprises an encryption module 111 for encryption of logged values in the memory 107, and a decryption module 111 for decryption of the encrypted values. The control system 100 comprises a notification module 108, such as a LED or any optical, acoustic or electrical notification signal for indication of occurrence of a parameter, such as a temperature, exceeding a specified threshold value.

Figure 2:
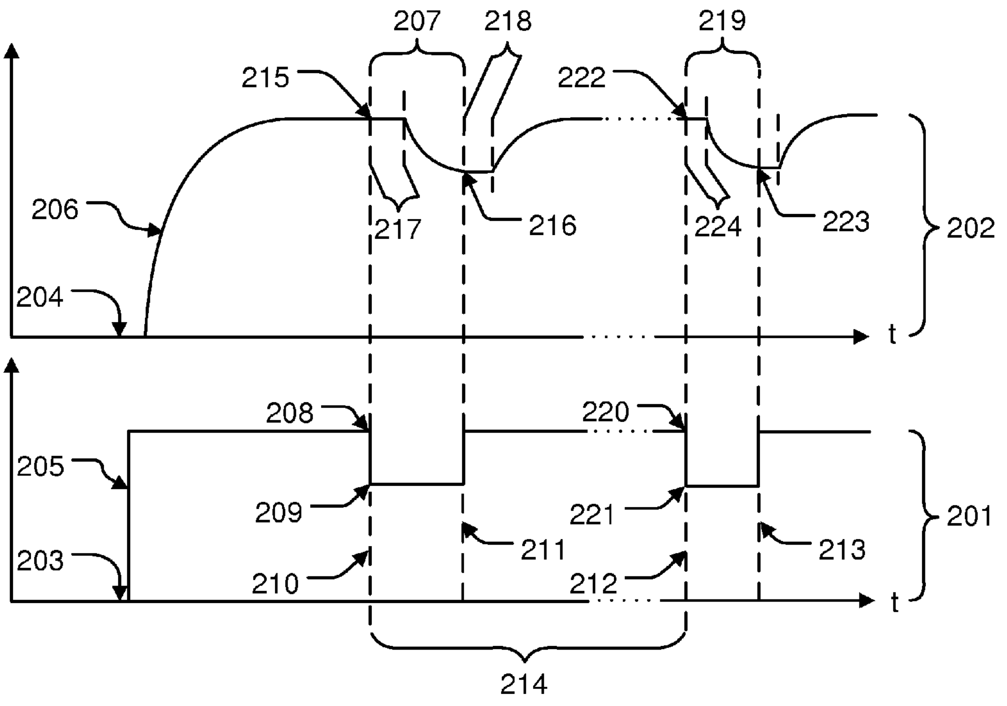
FIG. 2 shows an example of output of an illumination system and associated temperature response.

FIG. 2 shows an example of output 201 of an illumination system and associated temperature response 202 as function of time (t) for adaptive temperature regulation by the control system 100. The base temperature 204 detected without influence of the illumination system corresponds to zero output 203. The initial temperature response 206 is a result of an initial output 205 of the illumination system corresponding to an initial illumination parameter value. The illumination parameter may be current or voltage supplied to the illumination system, or be construed as specifying a light intensity, power consumption or heat energy emitted by the illumination system, light wave length, or any other parameter affecting temperature and the environment surrounding the illumination system.

Changing from a first value 208 to a second value 209 of an illumination parameter cause a temperature response as the temperature changes from a first 215 to a second 216 temperature value. A delay 207 of the response can be determined The delay is a result of ambient factors influencing the space between the illumination system and the temperature sensor, such as elements having different thermal characteristics, that will cause the elements to heat up or cool down at different speeds when exposed to the temperature controlled environment. The change between the first value 208 to the second value 209 of an illumination parameter at a time instant 210 may be within an interval that is not perceivable to the naked eye, such as a change in the light intensity with 10%. Flickering of the light is thus avoided. The first value 208 of the illumination parameter may be higher or lower than the second value 209. In FIG. 2, if output is changed when going from the level of the second value 209 to the level of the first value 208, a second temperature response is produced, and the delay of the response may be determined again. The time instant 211 at which the output is changed again may correspond to the instant of the detection of the second temperature value 216, at which the temperature variation may be within a threshold interval that is defined. As the temperature does not vary significantly by being inside such threshold interval, the response may be defined when the temperature changes from the first 215 to the second 216 temperature value, and a new instant change in output is initiated.

The temperature response comprise temperature characteristics of at least a first 215 and second 216 temperature value, the at least a first and second temperature value is associated with at least a first 210 and second 211 time value. The temperature response may comprise temperature characteristics of a set of temperature values as function of the time elapsed from the instant change in output parameter at a time instant 210. Each of the temperature values and time values produce a set of temperature characteristics of the response and describes the delay from the instant change in illumination output. Determining the delay 207 may comprise analyzing the temperature characteristics for the associated time values, such as the temperature lag 217, derivative, area, peak delay and duration.

The change in output is repeated at a time interval 214 separating the first change between a first value 208 and second value 209 of an illumination parameter and a second change between a third value 220 and fourth value 221 of an illumination parameter. The second change in output at a time instant 212 cause a temperature response between a first 222 and second 223 temperature value and an associated delay 219, which may be different from the delay 207 due to variations in the ambient factors. The temperature lag 217 or 218 may accordingly be different from the temperature lag 224. The control system 100 according to the embodiment in FIG. 1 adapts the output of the illumination system to the new temperature response with associated delay to regulate the temperature during the subsequent time interval, which will be described in the following with respect to FIG. 3.

Figure 3:
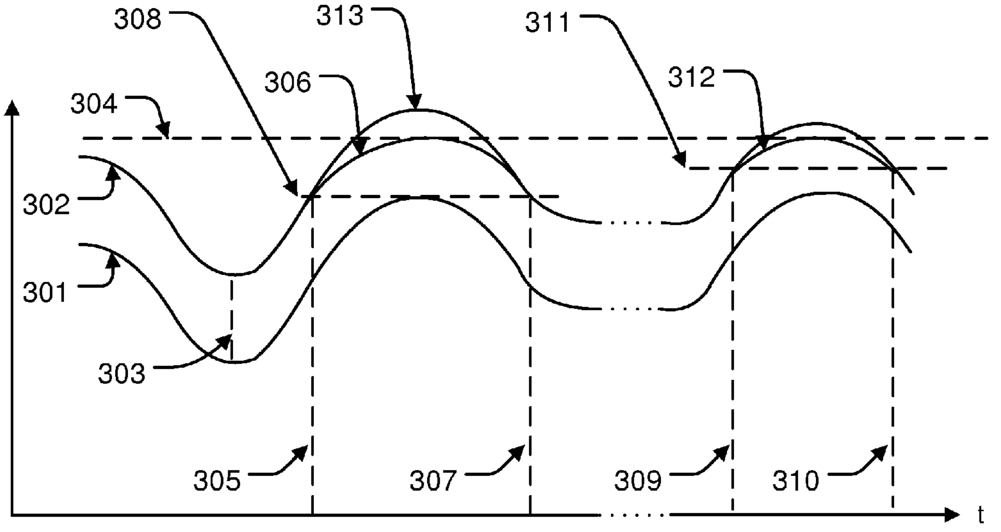
FIG. 3 shows an example of controlling an illumination system based on output of an illumination system and associated temperature response.

FIG. 3 shows an example of controlling an illumination system based on output of an illumination system and associated temperature response. Ambient factors lead to a variation in base temperature 301 where the contribution of the illumination system to the total temperature is subtracted. The total temperature value 302 is the temperature detected at the sensor, where the temperature contribution 303 of the illumination system may be defined. A threshold temperature value 304 is furthermore defined. The temperature response and associated delay determined according to the example in FIG. 2 may be used to predict the temperature response caused by the ambient factors, such that an adapted threshold 308 may be defined at which the output of the illumination system is changed at a time interval between a first time instant 305 and a second time instant 307. In FIG. 3 a temperature 313, without adapted illumination output, is changed to a reduced temperature 306 as the contribution of the illumination system is reduced due to a decrease in the output between the first time instant 305 and the second time instant 307 corresponding to a change from a first illumination parameter to a second illumination parameter. The reduced temperature 306 does not exceed the temperature threshold 304. The change in output may comprise of a range of different illumination parameter values determined from the temperature response and associated delay according to the example in FIG. 2 in order to regulate the temperature below the temperature threshold.

The adaptive temperature regulation may be critically damped or over damped. For example, the temperature response and associated delay may be input to a PID control algorithm of the control system 100, which may be critically damped or over damped.

During a time interval between the second time instant 307 and a third time instant 309 the ambient factors may have changed. The temperature response and associated delay 219 determined after the change of any ambient factors, according to the example in FIG. 2, is used to predict the temperature response caused by the new ambient factors in the scenario depicted in FIG. 3, and a new adapted threshold 311 may be defined. The adapted threshold 311 may be construed as a threshold at which the control system 100 starts to adapt the output of the illumination system. It may also be possible that the output may be adapted continuously throughout the control period from time zero if necessary to avoid exceeding the temperature threshold 304, particularly if the base temperature 301 is maintained close to the temperature threshold 304. The output of the illumination system is changed at a time interval between a third time instant 309 and a fourth time instant 310, and a reduced temperature 312 of the associated temperature response can be maintained below the temperature threshold 304. The time interval at which the control system 100 determines the delay, which may comprise analyzing temperature lag, derivatives, peak area, peak duration and peak delay or any other characteristics of the temperature response, may correspond to the time interval at which the ambient factors change.

Figure 4:
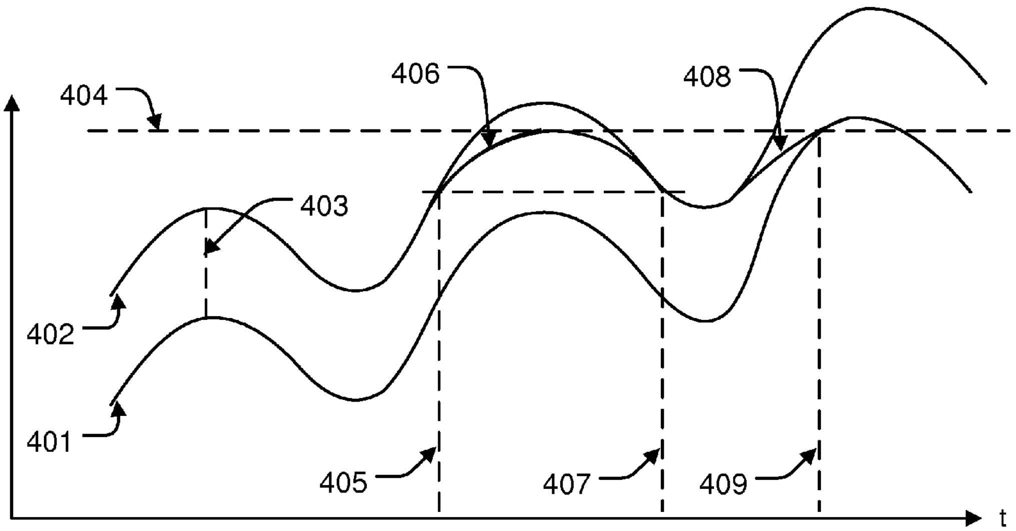
FIG. 4 shows another example of controlling an illumination system based on output of an illumination system and associated temperature response.

FIG. 4 shows another example of controlling an illumination system based on output of an illumination system and associated temperature response. The total temperature 402 is changed to a reduced temperature 406 as output of the illumination system is changed at a time interval between a first time instant 405 and a second time instant 407. The reduced temperature 406 is maintained within the temperature threshold 404. Ambient factors cause the temperature to rise between the second time instant 407 and a third time instant 409, and a reduced temperature 408 is detected as the output of the illumination system is lowered by the control system. However, due to external circumstances the base temperature 401 exceeds the temperature threshold 404 without the influence of the illumination system. The date and time for the exceeded threshold event is logged in the memory of the control system, and encrypted if temperature restrictions with legal basis are imminent. Read out would in that case require decryption of the stored values.

Although the present invention has been described in connection with particular embodiments thereof, it is to be understood that various modifications, alterations and adaptations may be made by those skilled in the art without departing from the claimed scope.

The invention claimed is:

1. A method for controlling an illumination system in a temperature controlled environment, the method comprises steps of:

causing the temperature change by first change of the output of the illumination system;

evaluating a temperature response to said first change of the output of the illumination system;

causing, after a predetermined time interval, the temperature change by second change of the output of the illumination system;

evaluating the temperature response to said second change of the output of the illumination system;

determining ambient conditions by evaluating the temperature responses relative to the first and second changes of the output of the illumination system;

determining changes of the ambient conditions by repeating the previous steps and comparing the evaluations sequentially;

regulating adaptively the output of the illumination system according to changes of the ambient conditions and the associated temperature response.

2. Method according to claim 1, comprising determining a delay of the temperature response.

3. Method according to claim 2, wherein the temperature response comprise temperature characteristics of at least a first and second temperature values, the at least a first and second temperature values are associated with at least a first and second time values, wherein the determining of the delay comprises analyzing the temperature characteristics between the at least first and second time values based on a temperature lag, derivatives, and area, or any combinations thereof.

4. Method according to claim 1, wherein the first and second changes of the output of the illumination system comprise changing between a first value and second value of an illumination parameter.

5. Method according to claim 1, wherein the temperature control comprises maintaining of a temperature within at least a first threshold value.

6. Method according to claim 1, wherein the adaptive temperature control comprises a critically damped, over damped control algorithm, or any combinations thereof.

7. Method according to claim 1, wherein values are logged for subsequent readout.

8. Method according to claim 7, wherein the values are logged when a temperature threshold value has been exceeded.

9. An illumination system for a temperature controlled environment comprising:

a sensor proximate to a casing of the temperature controlled environment; and a control system having memory, the controls system is configured to control an output of the illumination system, wherein, for detecting ambient conditions, the control system causes a temperature response in the temperature controlled environment by changing the output of the illumination system, the temperature response being detected by the sensor, and the control system is configured to regulate adaptively the output of the illumination system according to changes of the ambient conditions and the associated temperature response.

10. The illumination system according to claim 9, wherein the casing comprise a shelf being exposed to the temperature controlled environment, wherein the sensor is in thermally conductive communication with the shelf.

11. The illumination system according to claim 9, wherein the sensor is mounted within a predetermined threshold distance from heat generating elements of the illumination system.

12. The illumination control system according to claim 9, comprising at least one light source having at least one light emitting diode.

13. The illumination system according to claim 9, wherein the memory is configured for values are to be logged for subsequent readout.

14. The illumination system according to claim 13, wherein the memory is capable to log values when a temperature threshold value has been exceeded.

15. A method for controlling an illumination system in a temperature controlled environment, the method comprises steps of:

causing the temperature change by first change of the output of the illumination system;

measuring a temperature response to said first change of the output of the illumination system;

causing, after a predetermined time interval, the temperature change by second change of the output of the illumination system;

measuring the temperature response to said second change of the output of the illumination system;

determining the delay of the temperature response between said first change and said second change of the output of the illumination system;

quantifying an aggregate of ambient factors including ambient temperature based upon the delay of temperature response relative to the first and second changes of the output of the illumination system, the ambient temperature differing from the measured temperature in the controlled environment;

determining changes of the ambient factors by repeating the previous steps and comparing the evaluations sequentially;

regulating adaptively the output of the illumination system according to changes of the ambient factors and the associated temperature response.

* * * * *